United States Patent
Uesugi et al.

[11] Patent Number: 6,061,272
[45] Date of Patent: May 9, 2000

[54] WRITE CONTROL CIRCUIT FOR SEMICONDUCTOR MEMORY DEVICE

[75] Inventors: Kenya Uesugi, Ogaki; Sadao Yoshikawa, Gifu-ken, both of Japan

[73] Assignee: Sanyo Electric Co. Ltd., Osaka, Japan

[21] Appl. No.: 09/272,423

[22] Filed: Mar. 19, 1999

[30] Foreign Application Priority Data

Mar. 26, 1998 [JP] Japan ................................. 10-078787

[51] Int. Cl.[7] ................................................. G11C 16/00
[52] U.S. Cl. ................................ 365/185.23; 365/189.01
[58] Field of Search ........................ 365/185.23, 185.18, 365/185.28, 185.01, 189.11

[56] References Cited

U.S. PATENT DOCUMENTS

| | | | |
|---|---|---|---|
| 4,977,543 | 12/1990 | Youzi ................................. | 365/185.23 |
| 5,253,201 | 10/1993 | Atsumi et al. ...................... | 365/185.23 |
| 5,388,084 | 2/1995 | Itoh et al. .......................... | 365/185.23 |
| 5,801,987 | 9/1998 | Dinh ................................... | 365/185.23 |

*Primary Examiner*—Tan T. Nguyen
*Attorney, Agent, or Firm*—Fish & Richardson P.C.

[57] ABSTRACT

A write control circuit that generates a control signal to initiate a write operation for a semiconductor memory device, such as an EEPROM, compensates for fluctuations in the supply voltage. The write control circuit includes a control potential generator that produces a first control potential which is kept higher than the ground potential and a second control potential which is kept lower than the supply potential. A first transistor is connected to the supply potential and receives a write potential at its gate. A second transistor is connected between the first transistor and ground and receives the first control potential at its gate. A third transistor is connected to the supply potential and receives the second control potential at its gate. A fourth transistor is connected between the third transistor and ground and receives a potential from a first node between the first and second transistors at its gate. The control signal is generated at a second node between the third and fourth transistors. The control signal is activated when the write potential reaches a certain value.

3 Claims, 3 Drawing Sheets

WRITE CONTROL CIRCUIT FOR SEMICONDUCTOR MEMORY DEVICE

BACKGROUND OF THE INVENTION

The invention relates to a control circuit for use with a semiconductor memory device, and more particularly, to a circuit which controls a write operation.

A conventional electrically erasable programmable ROM (EEPROM) includes memory cells formed by a plurality of transistors each of a double gate construction having a floating gate and a control gate. Data is written into a memory cell transistor by accelerating hot electrons generated in a drain region of the floating gate into a source region, with part of the accelerated electrons being injected into the floating gate. Data is read by detecting a change in the operating characteristic of the memory cell transistor, which depends on the amount of charge injected into the floating gate. Thus, data is read by detecting a change in the threshold value of the memory cell transistor.

Referring to FIG. 1, a conventional semiconductor memory device 100 will now be described. The memory device 100 includes a plurality of pairs of memory cell transistors 1 arranged in a four row-one column array, and a row decoder 5 connected to the memory cell transistors 1. In FIG. 1, a column decoder is omitted from the illustration.

Each memory cell transistor 1 has an electrically isolating floating gate which stores a charge, a control gate partly overlapping with the floating gate, a source region and a drain region. The memory cell transistor 1 is turned on/off in accordance with a potential applied to the control gate. The memory cell transistor 1 has a threshold value which varies depending on the amount of charge stored on the floating gate. Two adjacent memory cell transistors 1 together form a pair.

A plurality of word lines 2 are disposed in a manner corresponding to each row of memory cell transistors 1, and connect the control gates of the memory cell transistors 1 to the row decoder 5. A bit line 3 is disposed in a manner corresponding to a column of memory cell transistors 1. The bit line 3 is connected in common to the drains of the memory cell transistors 1 and is connected to a sense amp, not shown. A plurality source lines 4 are connected in common to the sources of each of the pairs of memory cell transistors 1.

The row decoder 5 receives row address information from a control circuit, not shown, and produces row select signals LS1–LS4, each of which activates one of the four word lines 2. In response to a select clock $\phi L$, the row decoder 5 activates one of the row select signals LS1–LS4 and its corresponding word line 2. In this manner, the memory cell transistor 1 connected to the activated word line 2 is turned on.

While the memory cell transistors 1 are shown as disposed in one column in FIG. 1, it should be understood that the memory cell transistors 1 may be disposed to form a plurality of columns. In this instance, a column decoder, not shown, selects one of the columns in accordance with column address information. Subsequently, one of the plurality of memory cell transistors 1 in the selected columns is selected in accordance with the row address information.

A read-out circuit 6 is connected to the bit line 3. The read-out circuit 6 produces a potential Vd1 during a read operation in response to a read-out clock $\phi R$ from a control circuit, not shown. A write-in circuit 7 is connected to the source line 4. The write-in circuit 7 produces a potential Vd2 during a write operation in response to a write-in clock $\phi W$ from a control circuit, not shown, and feeds the potential Vd2 to the source line 4. The read-out circuit 6 and the write-in circuit 7 normally provide a ground potential Vs, except for intervals during which the read-out potential Vd1 and the write-in potential Vd2 are fed to the bit line 3 and the source line 4, respectively.

An HV generator circuit 8 boosts a supply potential in response to a predetermined clock pulse from a control circuit, not shown, thereby producing a potential Vhv which is higher than the supply potential. For example, the HV generator circuit 8 produces 14 V from the supply potential of 5 V. The HV generator circuit 8 feeds the high potential Vhv to the write-in circuit 7, which in turn feeds the high potential Vhv to the source line 4 as the write-in potential Vd2. A write-in control circuit 10 is connected to the HV generator circuit 8 and the write-in circuit 7. The write-in control circuit 10 receives the high potential Vhv from the HV generator circuit 8, and feeds a control signal HE to the write-in circuit 7 to initiate the write operation when the high potential Vhv is equal to or higher than a predetermined level.

The write-in and the read operation of the semiconductor memory device 100 will now be described. During the write operation, the ground potential Vs is applied to the drain of the memory cell transistor 1 via the bit line 3, and the write-in potential Vd2, which may be 14 V, for example, is applied to the source of the memory cell transistor 1 via the source line 4. When the select signals LS1–LS4 from the row decoder 5 are applied to the control gates of the memory cell transistors 1, a particular one of the memory cell transistors 1 is selected. The write-in current flows from the source region toward the drain region in the selected memory cell transistor 1, thus injecting a charge into the floating gate.

On the other hand, during the data read operation, the read-out potential Vd1, which may be 5 V, for example, is applied to the drain of the memory cell transistor 1 via the bit line 3, and the ground potential Vs is applied to the source of the memory cell transistor 1 via the source line 4. The select signals LS1–LS4 from the row decoder 5 allow a particular one of the memory cell transistors 1 to be selected. The read-out current flows from the drain region toward the source region in the selected memory cell transistor 1. At this time, the memory cell transistor 1 has a threshold value which is determined by the amount of charge stored on the floating gate. Accordingly, a potential on the bit line 3, which depends on this threshold value, is read out to the sense amp.

Referring now to FIGS. 2 and 3, the write-in control circuit 10 will be described. As shown in FIG. 2, the write-in control circuit 10 includes N-channel transistors 11, 12 and a CMOS inverter 13. The transistor 11 has a drain connected to the supply potential, a gate which receives the high potential Vhv, and a source connected to the N-channel transistor 12. The transistor 11 has a high voltage withstanding structure in which the opposite ends of the gate are spaced from the source and the drain. The transistor 12 has a drain connected to the source of the transistor 11, a source connected to the ground potential and a gate which receives the supply potential. The inverter 13 receives an input signal or a potential Va from a node between the transistor 11 and the transistor 12 and generates a control signal HE for initiating a write operation.

The operation of the write-in control circuit 10 will now be described with reference to FIG. 3. As the HV generator circuit 8 begins its boosting operation, the output potential Vhv begins to rise. When the output potential Vhv reaches a threshold value Vh0 of the transistor 11, the transistor 11 is tuned on and, the potential Va at the node between the transistors 11 and 12 rises. The threshold value Vh0 of the transistor 11 may be suitably changed depending on the potential required for the write operation. The inverter 13 causes the control signal HE to fall in response to the rising edge of the potential Va. The write-in circuit 7 commences its write operation in response to the falling edge of the control signal HE. In other words, the write-in circuit 7 commences the write operation when the high potential Vhv from the HV generator circuit 8 reaches the level Vh0, which is required for the write operation.

If the supply potential fluctuates in the write-in control circuit 10, an on resistance of the transistor 12 will vary, even if the threshold value of the transistor 11 is maintained constant. Accordingly, the timing of the falling edge of the control signal HE. A change in this timing leads to a change in the timing when the write-in circuit 7 commences the write operation. Specifically, the write-in circuit 7 may commence the write operation before the output potential Vhv from the HV generator circuit 8 rises to the required level Vh0 or may lag in commencing the write operation. Accordingly, a fluctuation in the supply potential causes an instability in the write operation by the write-in circuit 7, causing an error in the value written to the selected memory cell transistor 1.

It is an object of the present invention to provide a semiconductor memory device which enables a stable write operation.

SUMMARY OF THE INVENTION

To achieve the above objective, the present invention provides a write control circuit for use with a semiconductor memory device, which includes memory cell transistors and a write-in circuit, to control the timing of commencing a write operation by the write-in circuit, wherein the write-in circuit provides a write-in potential which is higher than a supply potential, said write control circuit comprising: a control potential generator for generating a first control potential which is maintained higher than the ground potential by a first predetermined voltage and a second control potential which is maintained lower than the supply potential by a second predetermined voltage; a first transistor connected to the supply potential and having a gate which receives a write-in potential; a second transistor connected between said first transistor and the ground potential and having a gate which receives the first control potential; a third transistor connected to the supply potential and having a gate which receives the second control potential; and a fourth transistor connected between said third transistor and the ground potential and having a gate which receives a potential at a first node between said first and second transistors, wherein a control signal commencing a write operation is delivered from a second node between said third and fourth transistors when the write-in potential reaches a predetermined potential.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 4:
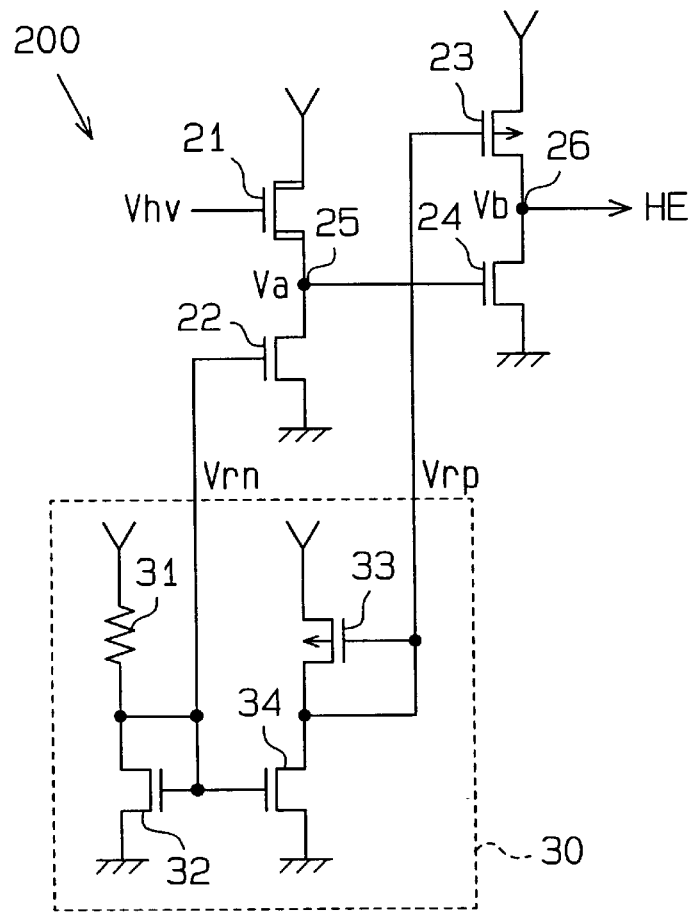
FIG. 4 is a circuit diagram of a write-in control circuit according to a first embodiment of the present invention.

Referring to FIG. 4, a write-in control circuit 200 for a semiconductor memory device according to a first embodiment of the present invention will now be described. The write-in control circuit 200 comprises first and second N-channel transistors 21, 22, a third P-channel transistor 23, a fourth N-channel transistor 24 and a control potential generator 30.

Figure 1:
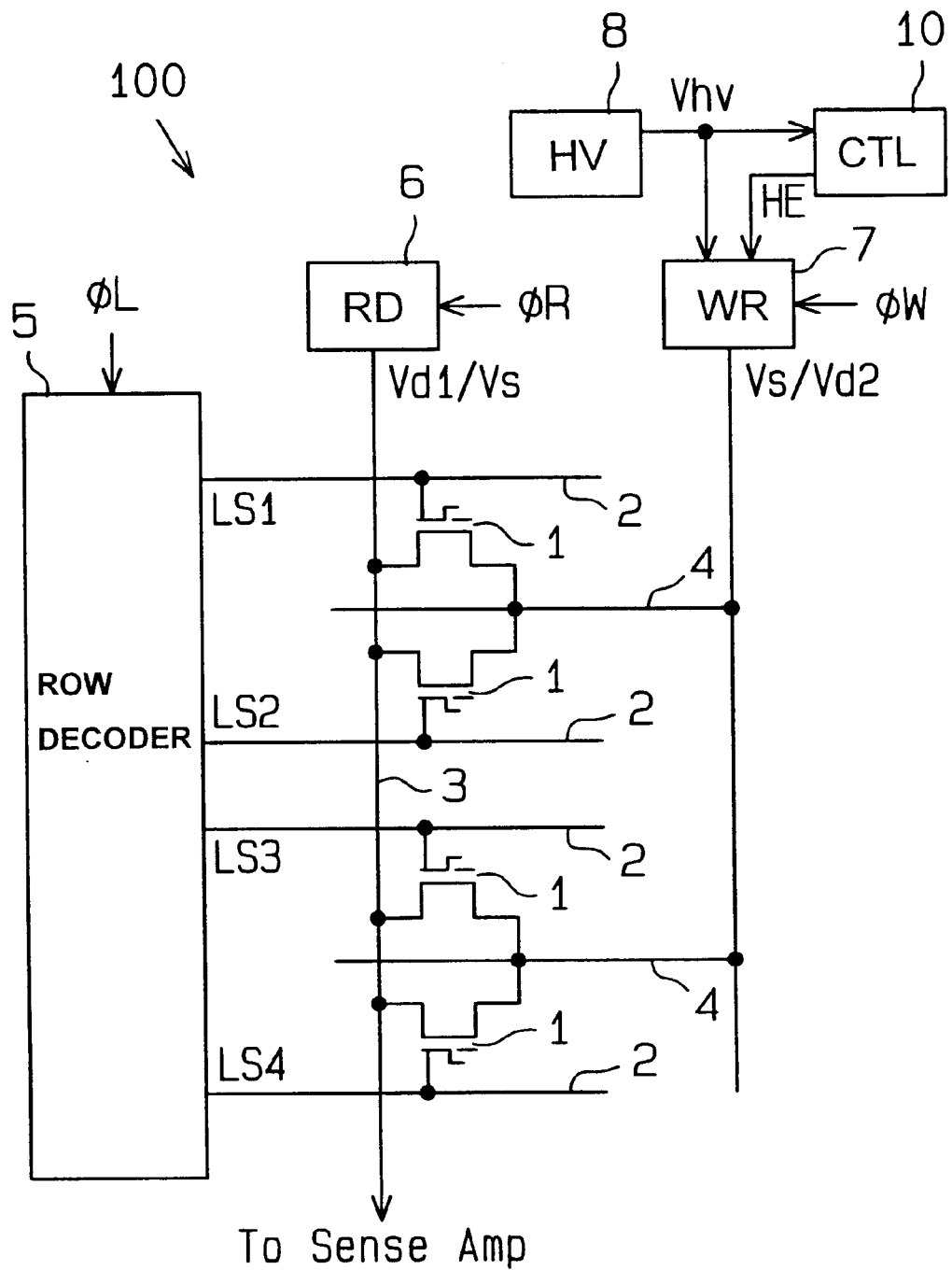
FIG. 1 is a circuit diagram of a conventional non-volatile semiconductor memory device.
Figure 2:
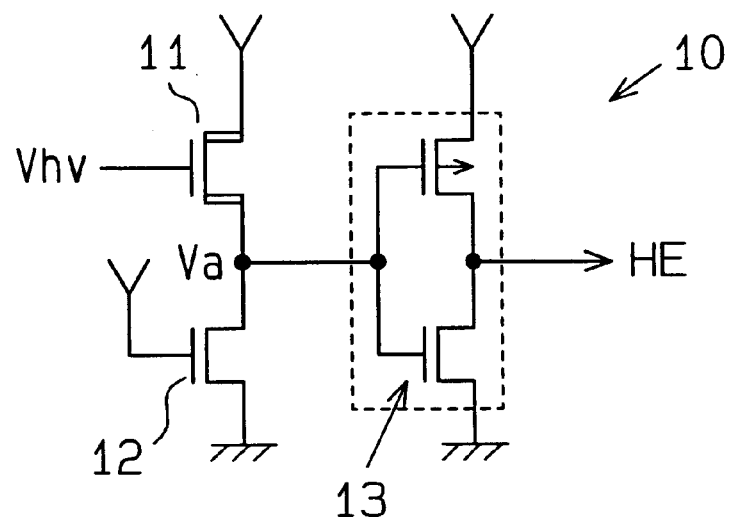
FIG. 2 is a circuit diagram of a conventional write-in control/circuit.
Figure 3:
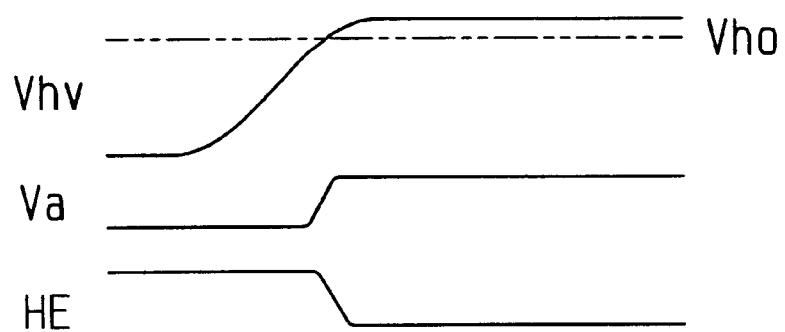
FIG. 3 is a timing chart illustrating the operation of the write-in control circuit shown in FIG. 2.

The first transistor 21 has a drain connected to the supply potential, a source connected to the second transistor 22, and a gate which receives the high potential Vhv which serves as the write-in potential. The transistor 21 has the same high voltage withstanding construction mentioned above in connection with the transistor 11 shown in FIG. 2. The second transistor 22 has a drain connected to the source of the first transistor 11, a source connected to the ground potential and a gate connected to the control potential generator 30. A first control potential Vrn from the control potential generator 30 is applied to the gate of the second transistor 22. In response to the control potential Vrn, the second transistor 22 is maintained in a condition intermediate between the on and the off condition, such that it serves as a resistor.

The third transistor 23 has a source connected to the supply potential, a drain connected to the fourth transistor and a gate connected to the control potential generator 30. A second control potential Vrp from the control potential generator 30 is applied to the gate of the third transistor 23 when the second control potential Vrp is applied to the third transistor 23, the third transistor 23 is maintained in a condition intermediate between the on and the off condition, such that it serves as a resistor. The fourth transistor 24 has a drain connected to the drain of the third transistor 23, a source connected to the ground potential and a gate connected to a first node 25 between the first and second transistors 21, 22. The potential Va at the first node is applied to the gate of the fourth transistor 24. A potential Vb at a second node between the third and fourth transistors 23, 24 is delivered as a control signal HE.

The control potential generator 30 includes a resistor 31, an N-channel fifth transistor 32, a P-channel sixth transistor 33 and a N-channel seventh transistor 34. The fifth to seventh transistors 32–34 together form a current mirror circuit. The resistor 31 and the fifth transistor 32 are connected in series between the supply and ground potential. The fifth transistor 32 has a drain and a gate, both of which are connected to the resistor 31, and a source connected to the ground potential. A potential at the node between the resistor 31 and the fifth transistor 32 or the gate-source voltage of the fifth transistor 32 is supplied as the first control potential Vrn to the gate of the second transistor 22. The sixth and seventh transistors 33, 34 are connected in series between the supply and the ground. The sixth transistor 33 has a source connected to the supply potential and a gate and a drain which are connected together. A potential at the node between the sixth and seventh transistor 33, 34 or the gate-source voltage of the sixth transistor is supplied as the second control potential Vrp to the gate of the third transistor 23. The seventh transistor 34 has a drain connected to the drain of the sixth transistor 33 and a gate connected to the gate of the fifth transistor 32.

The operation of the control potential generator 30 will now be described. The first control potential Vrn is maintained at a potential higher than the ground potential by a predetermined potential corresponding to the threshold value of the fifth transistor 32. The second control potential Vrp is maintained at a potential lower than the supply potential by a predetermined potential corresponding to the threshold value of the sixth transistor 33. Accordingly, the gate-source voltages Vrn, Vrp of the second and third transistors 22, 23 are maintained constant. As a consequence, there is no variation in the on resistance of the second and third transistors 22, 23. Thus, even if there is a fluctuation in the supply potential, the control signal HE falls at a stable rate when the high potential Vhv reaches the threshold value Vh0. Accordingly, initiation of the write operation by the write-in circuit 7 is stabilized, preventing the occurrence of a write-in error.

Figure 5:
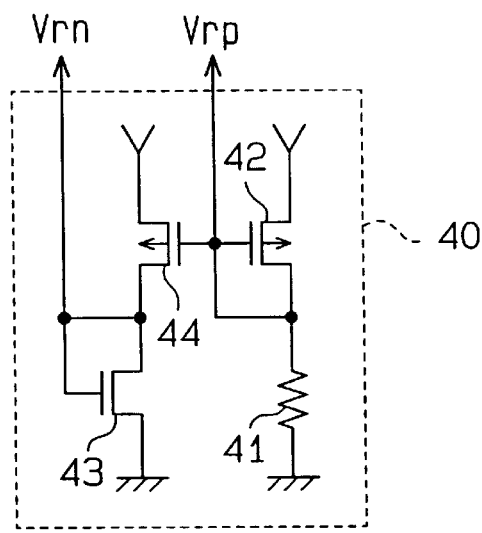
FIG. 5 is a circuit diagram of a write-in control circuit according to a second embodiment of the present invention.

Referring now to FIG. 5, a write-in control circuit for a semiconductor memory device according to the second embodiment of the present invention will be described. FIG. 5 only shows a control potential generator 40 which is different from that shown in the first embodiment, and the remaining circuit which is common to both of the embodiments is omitted from illustration.

The control potential generator 40 includes a resistor 41, a P-channel transistor 42, a P-channel transistor 43 and an N-channel transistor 44. In the control potential generator 40, the conductivity type of the transistors 32 to 34 used in the control potential generator 30 of the first embodiment is changed. It will be noted that the transistors 42 to 44 in the control potential generator 40 correspond to transistors 32 to 34, respectively, in the control potential generator 30.

The transistor 42 and the resistor 41 are connected in series between the supply and the ground. The transistor 42 has a source connected to the supply potential, and a gate and a drain which are connected together and to the resistor 41. A potential at the node between the resistor 41 and the transistor 42 or the gate-source voltage of the transistor 42 is the second control potential Vrp supplied to the gate of the transistor 23 (FIG. 4).

The transistors 43 and 44 are connected in series between the supply and the ground. The transistor 44 has a source connected to the supply potential, a gate connected to the gate of the transistor 42, and a drain connected to the drain and the gate of the transistor 43. The transistor 43 has a source connected to the ground potential, and a drain and a gate which are connected together and to the transistor 44. A potential at the node between the transistors 43 and 44 or the gate-source voltage of the transistor 42 is the first control potential Vrn supplied to the transistor 22 (FIG. 4).

In the control potential generator 40, the first control potential Vrn is maintained at a potential higher than the ground potential by a predetermined potential, and the second ground potential Vrp is maintained at a potential lower than the supply potential by a predetermined potential, in generally the same manner as in the control potential generator 30 shown in FIG. 4. Accordingly, stabilized potentials Vrn, Vrp are provided to the transistors 22, 23.

The present examples and embodiments are to be considered as illustrative and not restrictive and the invention is not to be limited to the details given herein, but may be modified within the scope and equivalence of the appended claims.

What is claimed is:

1. A write control circuit for use with a semiconductor memory device, which includes memory cell transistors and a write-in circuit, to control the timing of commencing a write operation by the write-in circuit, wherein the write-in circuit provides a write-in potential which is higher than a supply potential, said write control circuit comprising:

a control potential generator for generating a first control potential which is maintained higher than the ground potential by a first predetermined voltage and a second control potential which is maintained lower than the supply potential by a second predetermined voltage;

a first transistor connected to the supply potential and having a gate which receives a write-in potential;

a second transistor connected between said first transistor and the ground potential and having a gate which receives the first control potential;

a third transistor connected to the supply potential and having a gate which receives the second control potential; and a fourth transistor connected between said third transistor and the ground potential and having a gate which receives a potential at a first node between said first and second transistors, wherein a control signal commencing a write operation is delivered from a second node between said third and fourth transistors when the write-in potential reaches a predetermined potential.

2. The write control circuit according to claim 1, wherein said control potential generator includes a resistor connected to the supply potential, a fifth transistor connected between said resistor and the ground potential, and a sixth transistor and a seventh transistor connected in series between the supply and ground potential and forming a current mirror circuit together with the fifth transistor, wherein a potential between the resistor and the fifth transistor is delivered as the first control potential, and a potential between said sixth and seventh transistors is delivered as the second control potential.

3. The write control circuit according to claim 1, wherein said control potential generator includes a fifth transistor connected to the supply potential, a resistor connected between said fifth transistor and the ground potential, and a sixth transistor and a seventh transistor connected in series between the supply and ground potential and forming a current mirror circuit together with the fifth transistor, wherein a potential between the sixth and seventh transistors is delivered as the first control potential, and a potential between the resistor and the fifth transistor is delivered as the second control potential.

* * * * *